(12) United States Patent
Hein

(10) Patent No.: US 11,972,154 B2
(45) Date of Patent: Apr. 30, 2024

(54) CONFIGURABLE VARIABLE-LENGTH SHIFT REGISTER CIRCUITS

(71) Applicant: Allegro MicroSystems, LLC, Manchester, NH (US)

(72) Inventor: Matthew Hein, Dallas, TX (US)

(73) Assignee: Allegro MicroSystems, LLC, Manchester, NH (US)

( * ) Notice: Subject to any disclaimer, the term of this patent is extended or adjusted under 35 U.S.C. 154(b) by 37 days.

(21) Appl. No.: 17/816,758

(22) Filed: Aug. 2, 2022

(65) Prior Publication Data
US 2024/0045622 A1    Feb. 8, 2024

(51) Int. Cl.
| | |
|---|---|
| G11C 19/00 | (2006.01) |
| G06F 3/06 | (2006.01) |
| G11C 16/06 | (2006.01) |
| H03K 5/135 | (2006.01) |

(52) U.S. Cl.
CPC ............ *G06F 3/0679* (2013.01); *G11C 16/06* (2013.01); *G11C 19/00* (2013.01); *H03K 5/135* (2013.01)

(58) Field of Classification Search
None
See application file for complete search history.

(56) References Cited

U.S. PATENT DOCUMENTS

| | | | | |
|---|---|---|---|---|
| 3,652,998 | A | * | 3/1972 | Forney, Jr. ............ G06F 7/76 377/64 |
| 3,947,845 | A | * | 3/1976 | Lyon .................... G01S 13/79 342/30 |
| 7,436,217 | B2 | | 10/2008 | Lewko |
| 7,499,519 | B1 | * | 3/2009 | Hsieh .................... G11C 19/00 377/67 |
| 8,008,908 | B2 | | 8/2011 | Doogue et al. |
| 8,122,159 | B2 | | 2/2012 | Monreal |
| 8,222,888 | B2 | | 7/2012 | David et al. |
| 8,446,146 | B2 | | 5/2013 | Foletto et al. |
| 8,598,867 | B2 | | 12/2013 | Foletto et al. |
| 8,686,720 | B2 | | 4/2014 | Foletto et al. |
| 8,723,512 | B1 | | 5/2014 | Burdette et al. |
| 8,729,890 | B2 | | 5/2014 | Donovan et al. |

(Continued)

OTHER PUBLICATIONS

Brown et al. Fundamentals of Digital Logic with Verilog Design. 2003. McGraw-Hill. pp. 349-371.*

(Continued)

*Primary Examiner* — Nathan Sadler
(74) *Attorney, Agent, or Firm* — DALY, CROWLEY, MOFFORD & DURKEE, LLP

(57) ABSTRACT

Configurable variable-length shift register circuits include a group of flip-flops connected in a serial configuration. The plurality of flip-flops is connected to a serial data-in line and a clock line. Each flip-flop can include a data input, a clock input configured to receive a clock signal from the clock line, and a data output. The plurality of flip-flops can include a serial data-out line. The circuit includes a plurality of multiplexers connected to the plurality of flip-flops to enable a desired number of flip-flops for an application. A nonvolatile memory can be connected to the plurality of multiplexers and configured to receive a register-length indication, where the register-length indication corresponds to a selected number of flip-flops selected for enablement for a given application.

50 Claims, 9 Drawing Sheets

(56) References Cited

U.S. PATENT DOCUMENTS

| | | |
|---|---|---|
| 8,793,085 B2 | 7/2014 | Donovan et al. |
| 8,890,518 B2 | 11/2014 | Daubert |
| 8,957,676 B2 | 2/2015 | David et al. |
| 9,140,536 B2 | 9/2015 | Foletto et al. |
| 9,329,057 B2 | 5/2016 | Foletto et al. |
| 9,395,391 B2 | 7/2016 | Fernandez et al. |
| 9,552,315 B2 | 1/2017 | Monreal |
| 9,739,846 B2 | 8/2017 | Petrie et al. |
| 9,739,847 B1 | 8/2017 | Alpago et al. |
| 9,739,848 B1 | 8/2017 | Alpago et al. |
| 9,780,706 B2 | 10/2017 | Allegrini et al. |
| 9,804,249 B2 | 10/2017 | Petrie et al. |
| 10,056,364 B1 | 8/2018 | Klebanov et al. |
| 10,088,533 B2 | 10/2018 | Rivas et al. |
| 10,270,428 B1 | 4/2019 | Geisler et al. |
| 10,348,223 B1 | 7/2019 | Khosravi et al. |
| 10,481,220 B2 | 11/2019 | Alpago et al. |
| 10,557,873 B2 | 2/2020 | Latham |
| 10,608,430 B2 | 3/2020 | Lamar et al. |
| 10,747,708 B2 | 8/2020 | Kozomora et al. |
| 10,845,434 B2 | 11/2020 | Fernandez et al. |
| 11,005,642 B1* | 5/2021 | Yu .......................... G11C 19/28 |
| 11,009,565 B2 | 5/2021 | Fernandez et al. |
| 11,055,165 B2 | 7/2021 | Rigoni et al. |
| 11,327,127 B2 | 5/2022 | Lassalle-Balier et al. |
| 11,468,958 B1* | 10/2022 | Cheng ................... G11C 19/28 |
| 2008/0203859 A1* | 8/2008 | Kirchhofer ............ G05B 19/39 |
| | | 310/75 R |
| 2010/0074391 A1* | 3/2010 | Rose ...................... G11C 19/00 |
| | | 377/64 |
| 2012/0099696 A1* | 4/2012 | Geerlings .............. G11C 19/28 |
| | | 377/64 |
| 2012/0221882 A1* | 8/2012 | Morrison ................ H04L 25/14 |
| | | 713/500 |
| 2019/0121758 A1* | 4/2019 | Lawson .................... G06F 1/10 |
| 2019/0386648 A1* | 12/2019 | Miyano ..................... G11C 7/22 |
| 2021/0091692 A1 | 3/2021 | Lu |

OTHER PUBLICATIONS

Jacob et al. Memory Systems: Cache, DRAM, Disk. 2008. Elsevier. pp. 4-5.*
U.S. Appl. No. 17/805,070, filed Jun. 2, 2022, Myers et al.
U.S. Appl. No. 17/816,511, filed Aug. 1, 2022, Hein.
Ishtiaque Amin and James Lockridge, "Daisy Chain Implementation for Serial Peripheral Interface;" Texas Instruments Application Report, published Aug. 2018 (revised Apr. 2021), pp. 1-11; 11 pages.

* cited by examiner

CONFIGURABLE VARIABLE-LENGTH SHIFT REGISTER CIRCUITS

BACKGROUND

A general-purpose shift register is a type of digital memory circuit that typically includes several latches or flip-flops, also known as bistable gates, in a serial daisy-chain configuration. Data, in the form of binary digits (bits), enter a shift register at one end and emerge from the other end. Data bits are "clocked in" or "clocked out" using a clock signal that advances data from one flip-flop to the next in the chain. Data can be loaded into or read out of the shift register in series in this manner. The general structure of an example shift register is shown in FIG. 1.

As shown in FIG. 1, shift register 100 includes a daisy chain 102 having of bistable gates, a.k.a., flip-flops 104(1)-(N). A serial-data-in (SDI) line 106 provides data into the chain 102 and a clock signal line 108 is present. An interface driver 110 allows control of the chain 102, e.g., applying set and/or reset signals. A serial-data-out (SDO) line 112 provides data as an output of the circuit 100. Interface driver 110 has outputs connected to the set and clear inputs of each of the flip-flops 104(1)-(N), as indicated by the SET and CLR arrows with oblique dashes, respectively. Interface driver 110 also has inputs connected to the outputs of the flip-flops 104(1)-(N).

A conventional shift register, such as register 100 shown in FIG. 1, is defined with a certain length, or number of bits, according to the number of flip-flops in the register. For example, a 12-bit shift register has 12 flip-flops in a serial daisy-chain connection. The number of flip-flops defines in hardware the number of bits constituting one serial communication pattern (e.g., data "word"). For a 12-bit shift register, 12 bits of data are clocked in before the register is "full". The time that it will take to shift data into or out of the shift register is given by the number of bits multiplied by the clock frequency, i.e., $N \times f_{CLK}$, where N is the number of bits (=the number of flip-flops in the register) and $f_{CLK}$ is the clock frequency.

In order to decrease the amount of time it takes for communication of a given amount of data to occur (data in or data out), the clock frequency can be increased, however there are limits to such an approach. For example, using the common serial-peripheral-interface (SPI), communication is rated up to 10 MHz for serial communication between two integrated circuits on a printed circuit board. Faster clock speeds can be difficult to support due to transmission line effects and issues related to high-clock speeds, e.g., transient signals, phase noise, and jitter.

SUMMARY

An aspect of the present disclosure includes a configurable variable-length shift register circuit. The configurable variable-length shift register circuit can include a group (plurality) of flip-flops connected in a serial configuration. The plurality of flip-flops can include a serial data-in (SDI) line and a clock line. Each flip-flop can include a data input, a clock input configured to receive a clock signal from the clock line, and a data output. The plurality of flip-flops can include a serial data-out (SDO) line. The circuit can include a plurality of multiplexers connected to the plurality of flip-flops, where each multiplexer includes first and second data inputs and a control input, where one of the first and second data inputs is connected to the serial-in line, where the control input selects between the data inputs, and where each multiplexer includes an output connected to the input of a respective flip-flop. A nonvolatile memory can be connected to the plurality of multiplexers and configured to receive or store a register-length indication, where the register-length indication corresponds to a selected number of flip-flops selected for enablement for a given application. A programming interface can be included which is connected to the nonvolatile memory and configured to allow a user to input the register-length indication. The nonvolatile memory is operative to configure the plurality of multiplexers to enable a plurality of enabled flip-flops corresponding in number to the register-length indication, and where the plurality of enabled flip-flops is configured to produce an output data format of a desired bit-length. Other embodiments of this aspect include corresponding computer systems, apparatus, and computer programs recorded on one or more computer storage devices, each configured to perform the actions of the methods.

Implementations may include one or more of the following features. The circuit may include an interface driver configured to communicate with the plurality of flip-flops and one or more device registers, where the interface driver is connected to the output of each flip-flop, and where the interface driver is configured to move data between the plurality of flip-flops and the one or more device registers. The interface driver may include a serial interface. The serial interface may include a serial-peripheral interface (SPI). The serial interface may include universal asynchronous receiver/transmitter (UART) interface. The serial interface may include an I2C interface. Each of the flips-flops of the plurality of flip-flops can include a set input and a clear input, and where the interface driver is configured to provide set and clear signals to each of the flip-flops. The interface driver may be configured to transfer data to the plurality of enabled flip-flops in parallel. The circuit may include an integrated circuit. The nonvolatile memory may include an electrically-erasable read-only (EEPROM) memory. The nonvolatile memory may include one-time programmable (OTP) memory. The nonvolatile memory may include flash memory. The OTP may include ROM. The plurality of (N) multiplexers corresponds in number to the plurality of (N) flip-flops. The plurality of flip-flops may include N flip-flops and the plurality of multiplexers may include N or N−1 multiplexers. The plurality of multiplexers can be connected to the plurality of flip-flops, and where a first flip-flop in the serial configuration is not connected to a multiplexor, e.g., in an N−1 multiplexor configuration. The first flip-flop is configured to receive data from the serial-in line. The plurality of flip-flops may include set-reset (S-R) flip-flops. The plurality of flip-flops may include JK flip-flops. The plurality of flip-flops may include data (D) flip-flops. The plurality of flip-flops may include toggle (T) flip-flops. The output data format may include a serial format. Implementations of the described techniques may include hardware, a method or process, or computer software on a computer-accessible medium.

A further aspect of the present disclosure includes a configurable variable-length shift register integrated circuit (IC). The configurable variable-length shift register integrated circuit also includes a plurality of flip-flops connected in a serial configuration, where the plurality of flip-flops is connected to a serial-in line and a clock line having, where in each flip-flop includes a data input, a clock input configured to receive a clock signal from the clock line, and a data output, and where the plurality of flip-flops includes a serial-out line. The circuit can include a plurality of multiplexers connected to the plurality of flip-flops, where each multiplexor includes first and second data inputs and a control input, where the control input selects between the data inputs, and where each multiplexer includes an output connected to the input of a respective flip-flop. The circuit can include a nonvolatile memory connected to the plurality of multiplexers and configured to enable one or more flip-flops by configuration of the plurality of multiplexers, where the register-length indication corresponds to a selected number of flip-flops selected for enablement. A programming interface may be present that is connected to the nonvolatile memory and configured to allow a user to input the register-length indication. The circuit can include an interface driver configured to communicate with the plurality of flip-flops and one or more device registers, where the interface driver is connected to the output of each flip-flop, and where the interface driver is configured to move data between the plurality of flip-flops and the one or more device registers. The nonvolatile memory can be operative to configure the plurality of multiplexers to enable a number of flip-flops corresponding to the register-length indication and configure the variable-length register to produce an output data format of a desired bit-length. Other embodiments of this aspect include corresponding computer systems, apparatus, and computer programs recorded on one or more computer storage devices, each configured to perform the actions of the methods.

Implementations may include one or more of the following features. The IC where the nonvolatile memory may include an electrically-erasable read-only (EEPROM) memory. The nonvolatile memory may include one-time programmable (OTP) memory. The nonvolatile memory may include flash memory. The OTP may include ROM, The interface driver may include a serial interface. The serial interface may include a serial-peripheral interface (SPI). The serial interface may include universal asynchronous receiver/transmitter (UART) interface. The serial interface may include an I2C interface. Each of the flips-flops of the plurality of flip-flops may include a set input and a clear input, and where the interface driver is configured to provide set and clear signals to each of the flip-flops. The plurality of (N) multiplexers can correspond in number to the plurality of (N) flip-flops. The plurality of flip-flops may include N flip-flops and the plurality of multiplexers may include, e.g., N or N-1 multiplexers, in some examples. The plurality of multiplexers may be connected to the plurality of flip-flops, where a first flip-flop in the serial configuration is not necessarily connected to a multiplexor. The first flip-flop may be configured to receive data from the serial-in line. The plurality of flip-flops may include set-reset (S-R) flip-flops. The plurality of flip-flops may include JK flip-flops. The plurality of flip-flops may include data (D) flip-flops. The plurality of flip-flops may include toggle (T) flip-flops. The interface driver is connected to one or more device registers. The one or more device registers are connected to transducer circuitry. The transducer circuitry may include a sensor. The sensor may include a magnetic field sensor. The magnetic field sensor may include one or more hall effect elements. The magnetic field sensor may include one or more magnetoresistance elements. The sensor may include a temperature sensor. The sensor may include a current sensor. The transducer circuitry may include an analog-to-digital converter (ADC).

A system of one or more computers can be configured to perform particular operations or actions, as described for shift register circuitry herein, by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the present disclosure, which is susceptible of many embodiments. What follows is illustrative, but not exhaustive, of the scope of the present disclosure.

BRIEF DESCRIPTION OF THE DRAWINGS

The manner and process of making and using the disclosed embodiments may be appreciated by reference to the figures of the accompanying drawings. In the figures like reference characters refer to like components, parts, elements, or steps/actions; however, similar components, parts, elements, and steps/actions may be referenced by different reference characters in different figures. It should be appreciated that the components and structures illustrated in the figures are not necessarily to scale, emphasis instead being placed upon illustrating the principals of the concepts described herein. Furthermore, embodiments are illustrated by way of example and not limitation in the figures, in which.

DETAILED DESCRIPTION

The features and advantages described herein are not all-inclusive; many additional features and advantages will be apparent to one of ordinary skill in the art in view of the drawings, specification, and claims. Moreover, it should be noted that the language used in the specification has been selected principally for readability and instructional purposes, and not to limit in any way the scope of the inventive subject matter. The subject technology is susceptible of many embodiments. What follows is illustrative, but not exhaustive, of the scope of the subject technology.

Prior to describing examples and embodiments of the present disclosure some information is provided for context.

In existing circuits, the number of bits available to be used is fixed in hardware and cannot be adjusted in an application. When serially communicating data between integrated circuits, the total transmission time will depend on the bit length. A longer bit length allows for more resolution or data transferred at the cost of a longer transmission time. To implement a different bit length, the hardware (integrated circuit) of a prior art shift register must be redesigned.

One aspect of the present disclosure provides for configurable variable-length shift registers and shift-register circuits. These can provide a decrease in transmission time for a given application/situation by selectively decreasing the number of bits which are transmitted (e.g., the functional data word length). Such variable-length shift registers allow for a shift register length to be adjusted through configuration. This circuit allows system designers to make or implement, at the application or software level rather than at the hardware level, a trade-off between the number of bits of communication and the total transmission time.

Figure 1:
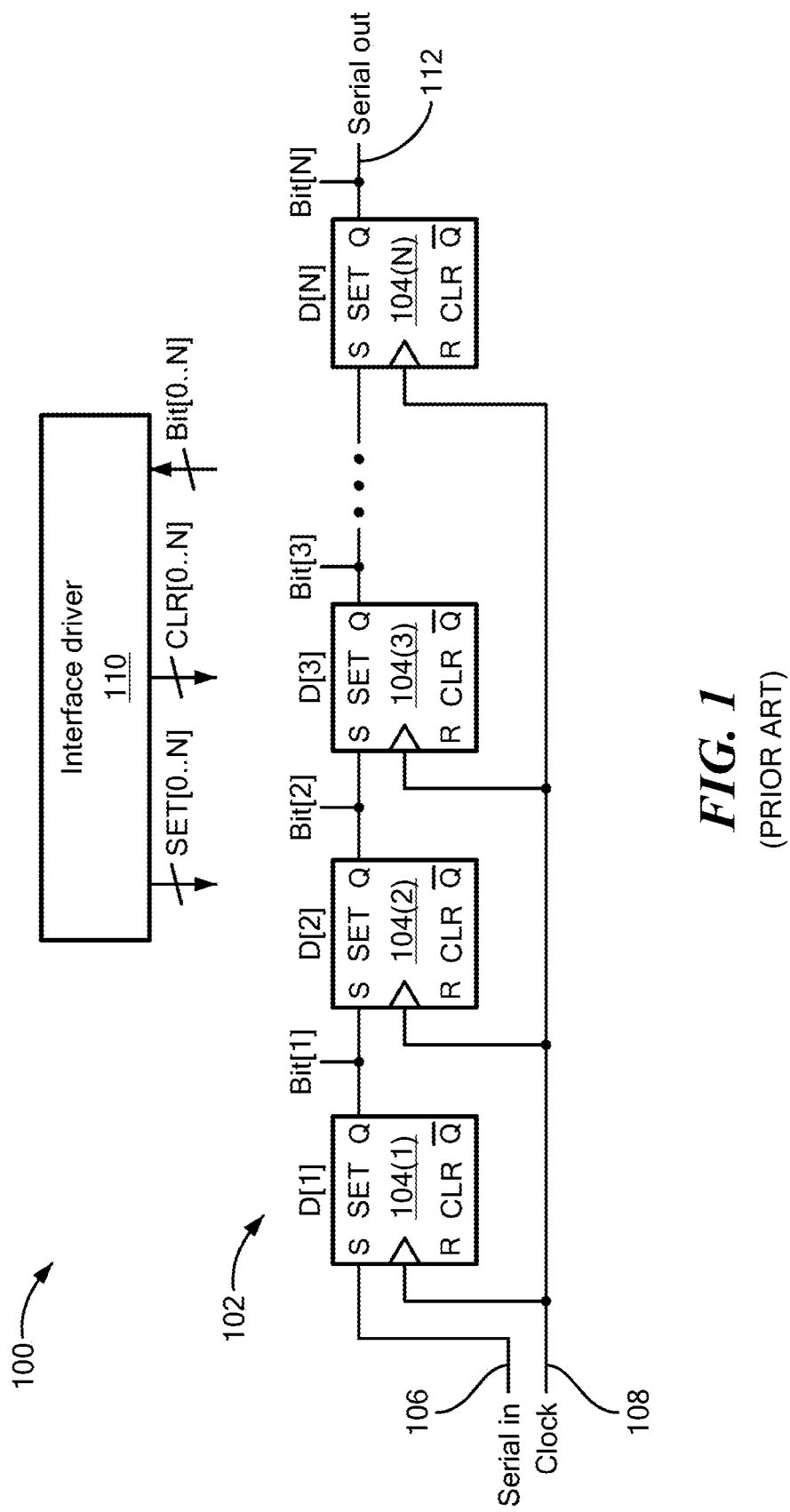
FIG. 1 is a block diagram of a prior art shift register.
Figure 2:
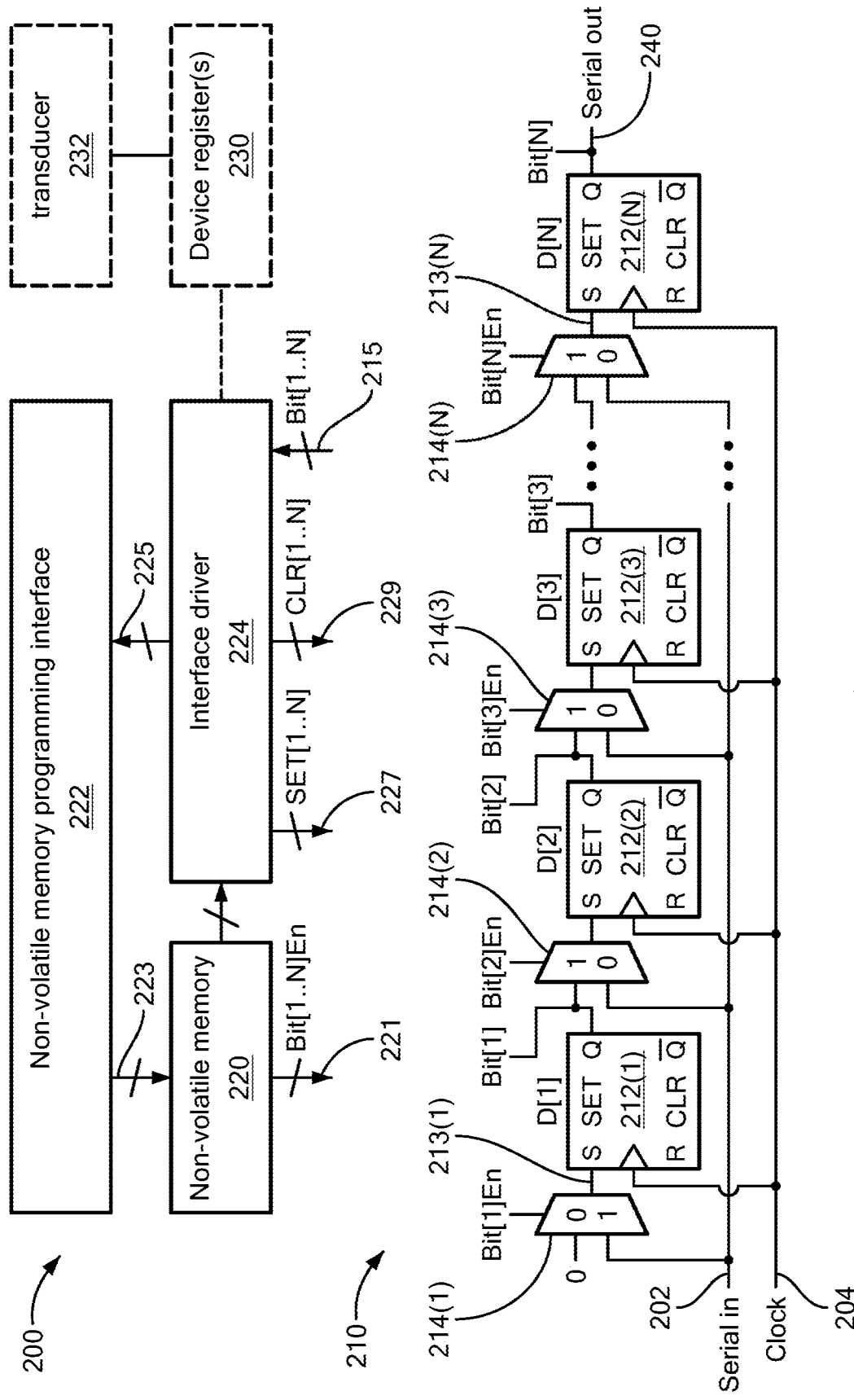
FIG. 2 is a block diagram of an example configurable variable-length shift register circuit, in accordance with the present disclosure.

FIG. 2 is a block diagram of an example configurable variable-length shift register circuit 200, in accordance with the present disclosure. Circuit 200 can include a daisy-chain (series) of flip-flops 212(1)-(N) and multiplexers (MUXes) 214(1)-(N), non-volatile memory 220, a non-volatile memory programming interface 222, and an interface driver 224. Serial-data-in (SDI) line 202 and clock line 204 are shown, along with serial-data-out (SDO) line 240.

Daisy-chain 210 can include multiple flip-flops 212(1)-(N) and multiplexers (MUXes) 214(1)-(N) in a series configuration. The maximum number of flip-flops may be set, e.g., 6, 8, 12, 24, etc. As shown, a MUX 214 can be present for a flip-flop input, e.g., 213(1), of one or more of flip-flops 212(1)-(N) having inputs 213(1)-213(N), respectively. The MUXes 214(1)-(N) can be controlled or configured by the contents of the non-volatile memory 220. The contents of the volatile memory 220 can describe or set which flip-flops 212 to bypass for any given application, to adjust the size of the variable-length shift register (and its data length in bits). For the example shown, each of the flip-flops 212(1)-(N) is shown as connected to a respective MUX 214(1)-(N). In other examples, however, a MUX may be omitted from the input of one or more flip-flops, e.g., left-most flip-flop 212(1), etc.

Non-volatile memory 220 can be included for the circuit 200 to store its configuration (e.g., number of flip-flops to be enabled) after power cycle events. Non-volatile memory 220 can have connections 221 to the individual MUXes 214(1)-(N) connected to flip-flops 212(1)-(N). By appropriately selecting a state for each MUX, the associated flip-flop can be enabled or disabled to adjust the selected size of the shift register 200 as desired. For the connections shown 221, the arrow with oblique dash indicates a separate line to each MUX 214(1)-(N) connected to a respective flip-flop. The non-volatile memory 220 can store information relating to which flip-flops 212(1)-(N) (which correspond to the selected size in bits) of the variable-length shift register should be enabled.

Non-volatile memory programming interface 222 allows the device non-volatile memory to be configured. The user interface 222 has an output 223 connected to the non-volatile memory 220. This interface 222 can include or be connected to, e.g., a keyboard or touch screen, etc. (not shown), and allows users to set the non-volatile memory contents.

Interface driver 224 is a circuit configured to provides an interface for serial (e.g., SPI) communication. Using the interface driver 224, data from the variable-length shift register (e.g., daisy chain 210) can be loaded into one or more device registers 230 and information from the device register(s) can be loaded into the enabled flips-flops of the daisy chain 210. Device register(s) 230 may be associated or included with a sensor or transducer 232 or other circuit/device, e.g., a motor controller or motor driver, etc. Interface driver 224 can supply an output to the programming interface 222 via connections 225. Interface driver 224 can have (input) connections 215 to the flips-flops 212(1)-(N) for receiving data. Interface driver 224 can also have (output) connections 227 and 229 to flip-flops 212(1)-(N) at the set and reset (clear) inputs, respectively.

Figure 3A:
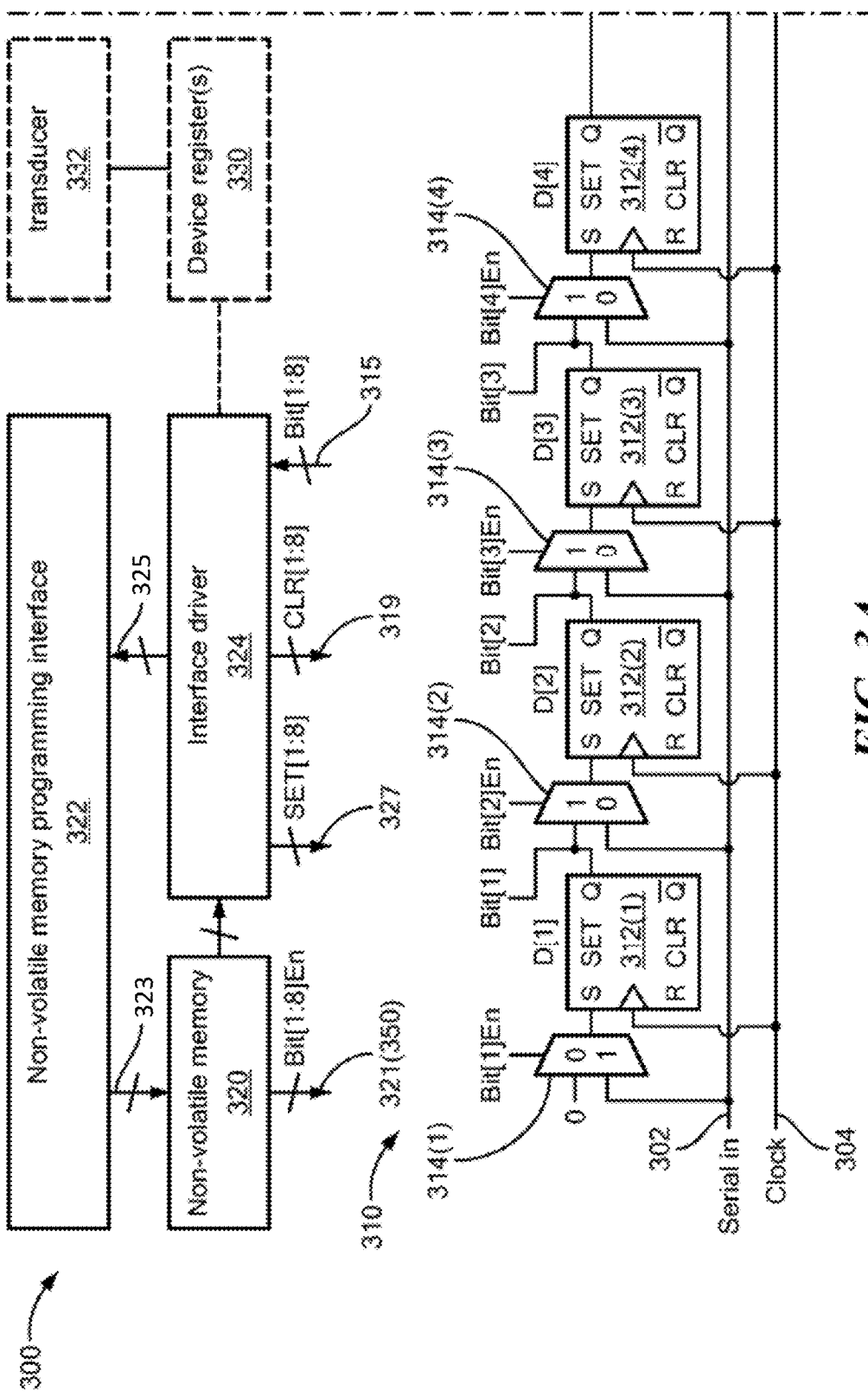
FIGS. 3A-C are block diagrams of a further example of a configurable variable-length shift register circuit in different configurations, in accordance with the present disclosure.
Figure 3A:
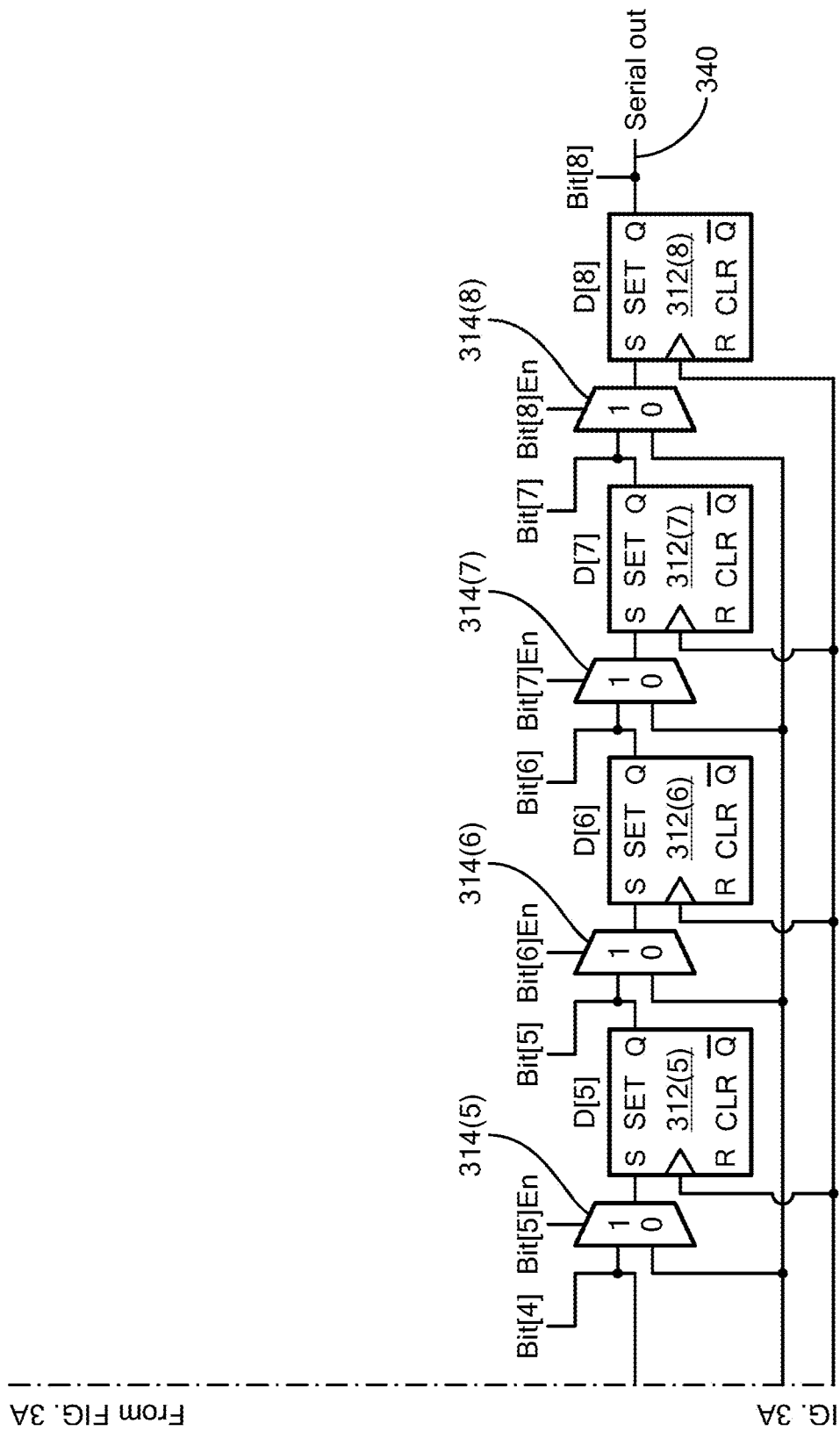
Figure 3B:
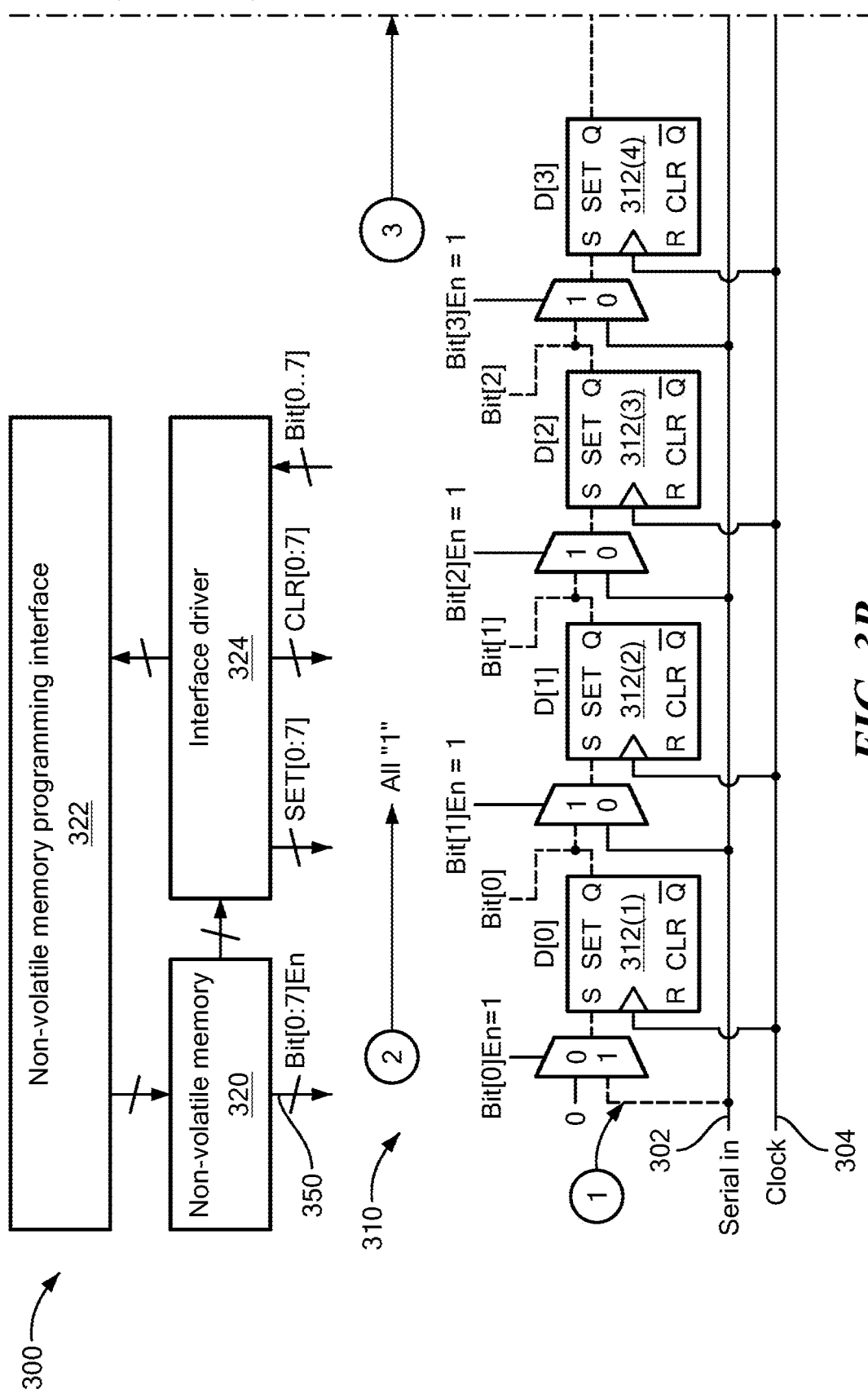
Figure 3B:
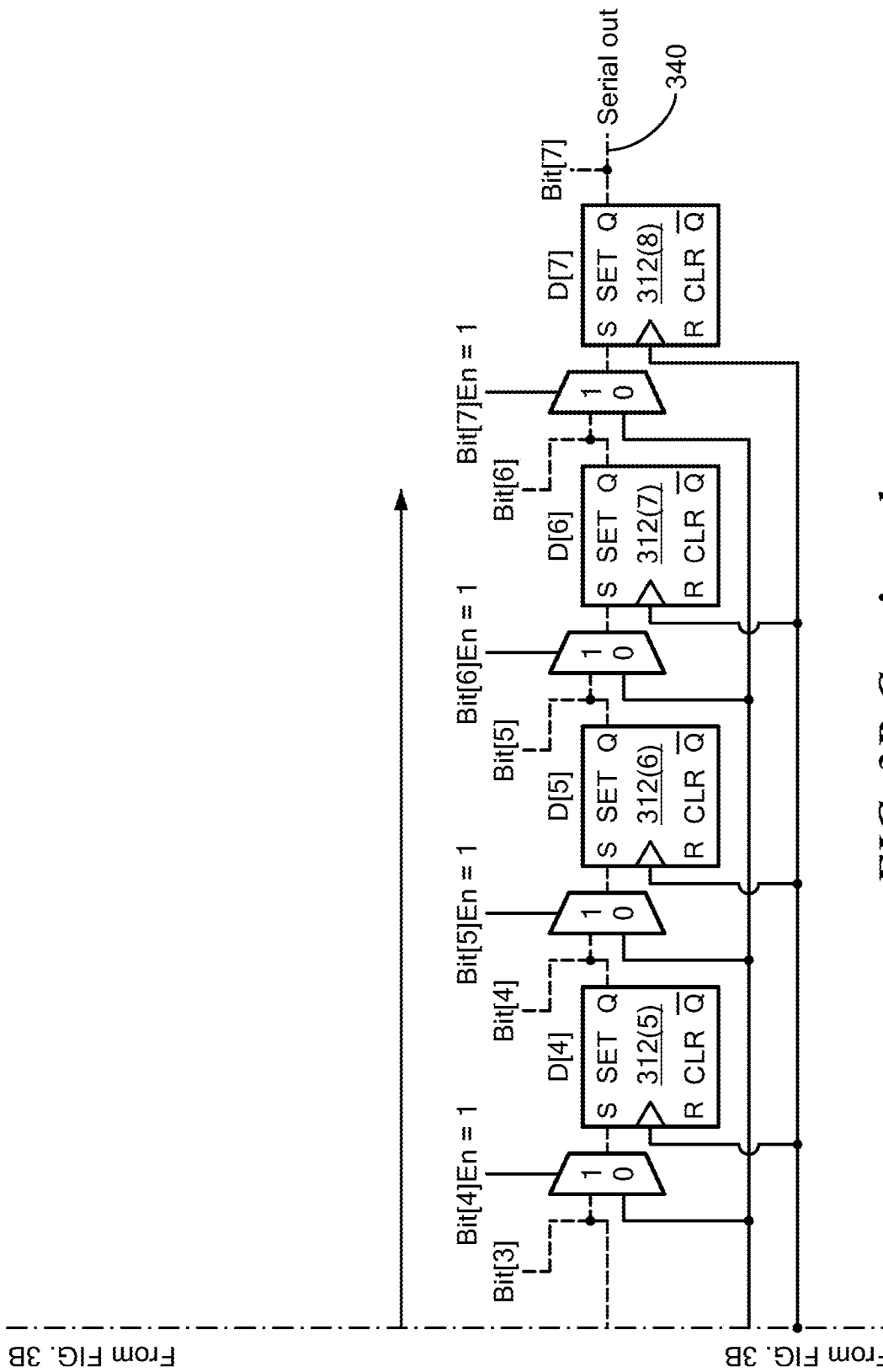
Figure 3C:
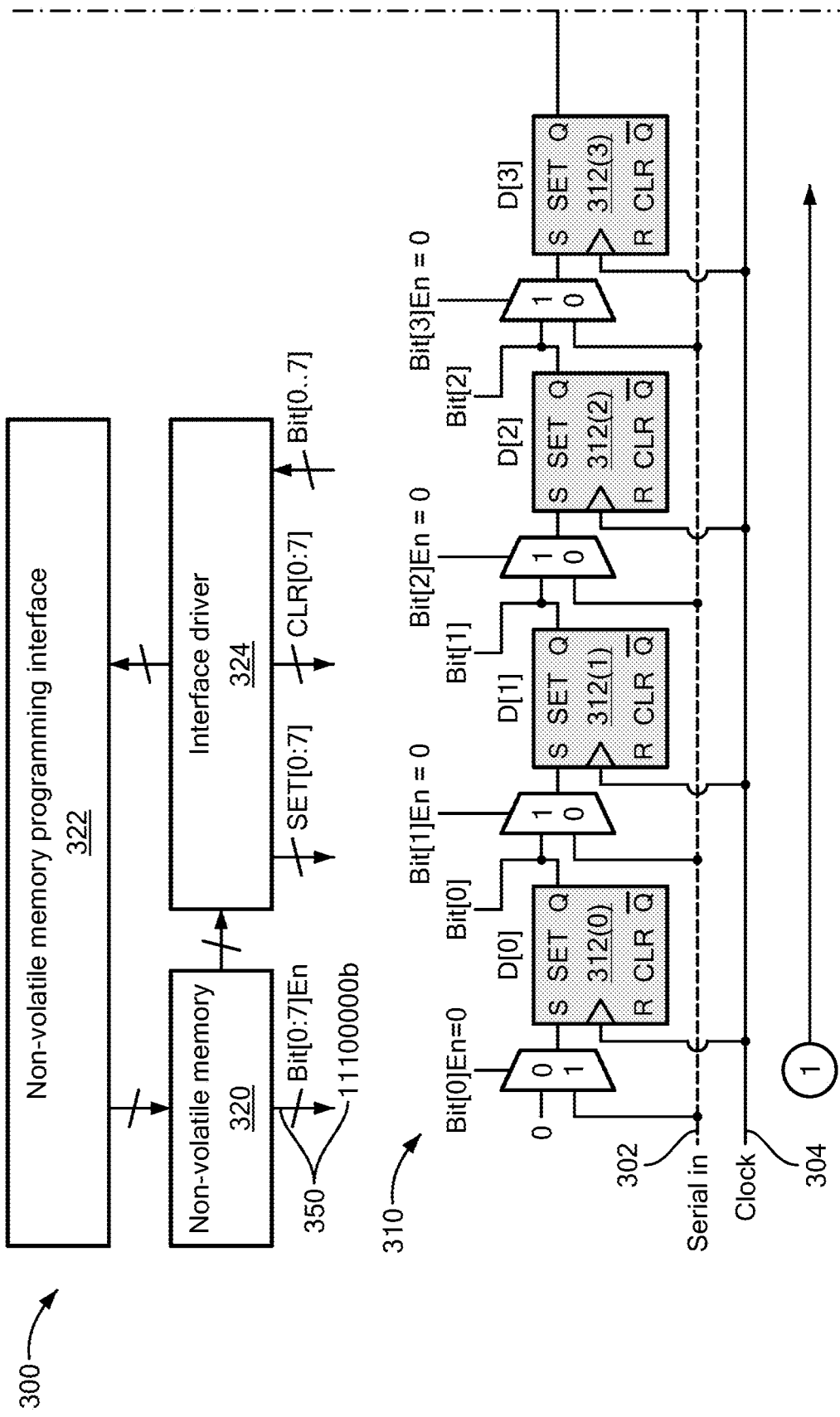
Figure 3C:
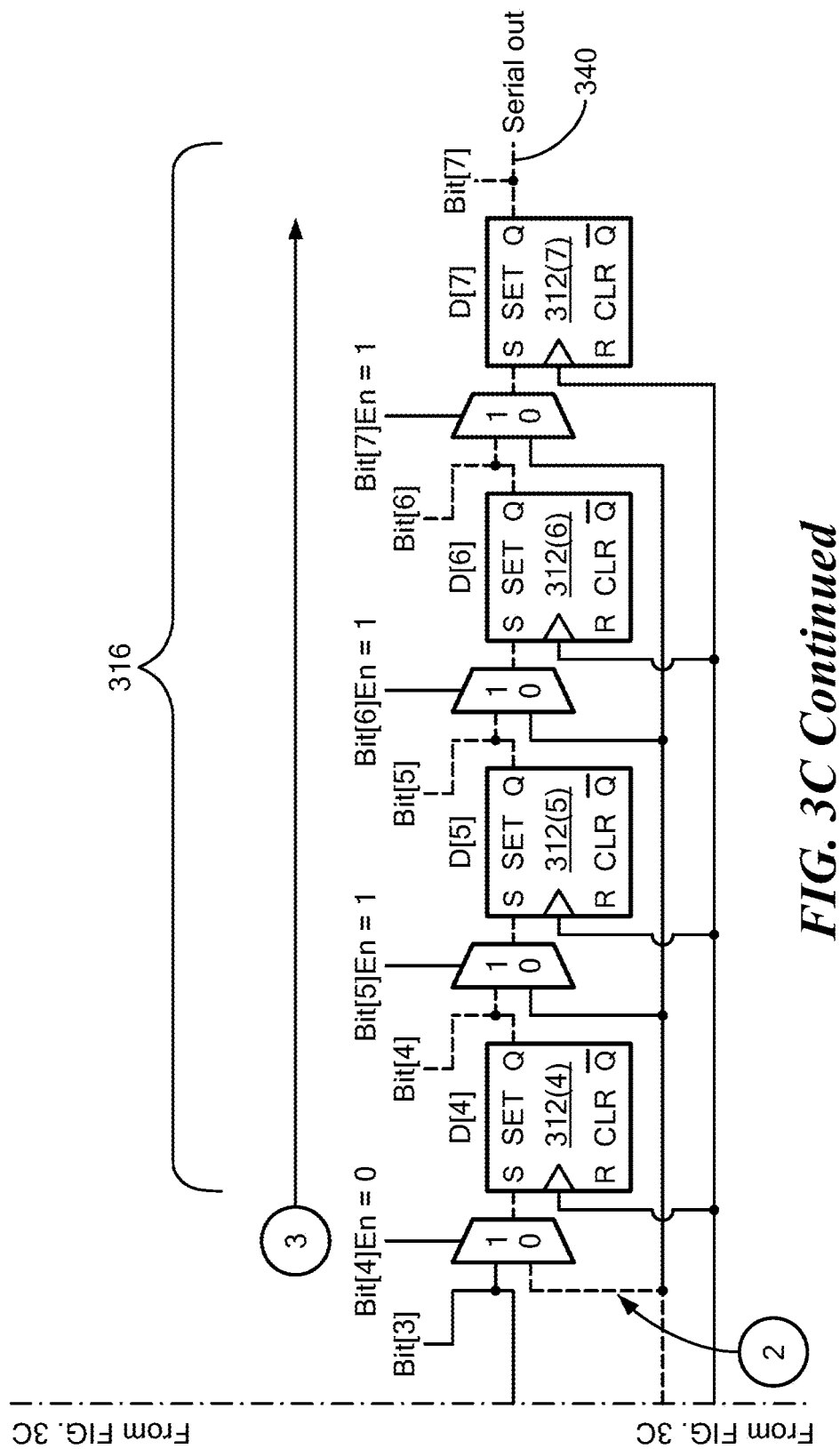

FIGS. 3A-3C are block diagrams of a further example of a configurable variable-length shift register circuit 300 in different configurations, in accordance with the present disclosure.

As shown in FIG. 3A, configurable variable-length shift register circuit 300 includes a serial configuration (daisy chain) 310 of flip-flops 312(1)-(N) and associated MUXes 314(1)-(N), with eight flip-flops shown, i.e., 312(1)-312(8). Flip-flop 312(8) is shown having output 340 (indicated as "serial out"). The maximum number of flip-flops, i.e., N, may be set or selected as desired for a given application, e.g., 6, 8, 12, 24, etc. A MUX 314 can be present for and connected to a given flip-flop, e.g., 313(1), by a connection to an input of the flip-flop, e.g., a set (S) input. The MUXes 314(1)-(N) can be controlled or configured by the contents (e.g., a configuration setting 350, which may include or be referred to as a "register-length indication") of the nonvolatile memory 320. The contents of the non-volatile memory 320 can describe or set which flip-flops 312 to bypass for any given application, to adjust the size of the variable-length shift register (and its data length in bits). For the example shown, each of the flip-flops 312(1)-(N) is shown as connected to a respective MUX 314(1)-(N). In other examples, however, a MUX may be omitted from the input of one or more flip-flops, e.g., left-most flip-flop 312(1), etc.

Non-volatile memory 320 can be included for the circuit 300 to store its configuration, such as the number of flip-flops to be enabled for a particular application, after power cycle events (e.g., loss of power). Non-volatile memory 320 can have connections 321 (providing a configuration setting 350) to the individual MUXes 314(1)-(N) connected to flip-flops 312(1)-(N). By appropriately selecting a state for each MUX, the flip-flop associated with the MUX can be enabled or disabled to adjust the selected size of the shift register 300 as desired. For the connections shown 321, the arrow with oblique dash indicates a separate line to each MUX 314(1)-(N) connected to a respective flip-flop. The non-volatile memory 320 can store information (e.g., a configuration setting 350) relating to which flip-flops 312(1)-(N) of the variable-length shift register should be enabled.

Non-volatile memory programming interface 322 allows the device non-volatile memory to be configured. The user interface 322 has an output 323 connected to the non-volatile memory 320. This interface 322 can include or be connected to, e.g., a keyboard or touch screen, etc. (not shown), and allows users to set the non-volatile memory contents.

Interface driver 324 provides an interface for serial (e.g., SPI) communication. Using the interface driver 324, data from the variable-length shift register (e.g., daisy chain 310) can be loaded into one or more device registers 330 and information from the device register(s) can be loaded into the enabled flips-flops of the daisy chain 310. Device register(s) 330 may be associated or included with a sensor or transducer 332 or other circuit/device, e.g., a motor controller or motor driver, etc. Interface driver 324 can supply an output to the programming interface 322 via connections 325. Interface driver 324 can have (input) connections 315 to the flips-flops 312(1)-(N) for receiving data. Interface driver 324 can also have (output) connections 327 and 329 to flip-flops 312(1)-(N) at the set and reset (clear) inputs, respectively.

One of ordinary skill in the art will appreciate that, while the individual flips-flops 314(1)-(N) of the group of flip-flops in FIG. 3A are denoted with index values (subscripts) ranging from 1-N, different index values may equivalently be used for the same group of flip-flops. For example, commands/instructions used for the circuit 300 may include machine readable instruction that refer to the daisy chain of flip-flops as having an index starting with 0 and ending in a value of N−1, as shown in FIGS. 3B-C.

FIG. 3B shows the configurable variable-length shift register circuit 300 with eight (8) flip-flops enabled. As noted above, the configuration setting 350 in the non-volatile memory controls the configuration of the flip-flops by enabling all eight of the flip-flips for use in the application shown. The configuration setting 350 indicated, i.e., all ones (1's), or "11111111," enables all eight of the flip-flops of the circuit 300. The flow of data is shown by arrows circled arrows 1-3. The configuration shown—with eight flip-flops enabled for use—results in serial data transfer in groupings of 8 bits (one byte).

FIG. 3C shows the configurable variable-length shift register 300 with four (4) flip-flops enabled. As indicated, the configuration setting 350 in the non-volatile memory controls the configuration of the enabled flip-flops by enabling (just) four of the flip-flips for use in the application shown. The configuration setting 350 indicated, i.e., all ones (1's), or "11100000b," (where "b" indicates binary) enables the rightmost four flip-flops of the circuit 300. The configuration shown—with four flip-flops enabled for use—results in serial data transfer in groupings of four bits. The flow of data is shown by arrows circled arrows 1-3. Relative to the configuration of FIG. 3B, the configuration of FIG. 3C will provide data transfer twice as fast as the configuration shown in FIG. 3B (for data limited in size to 4 bits).

Figure 4:
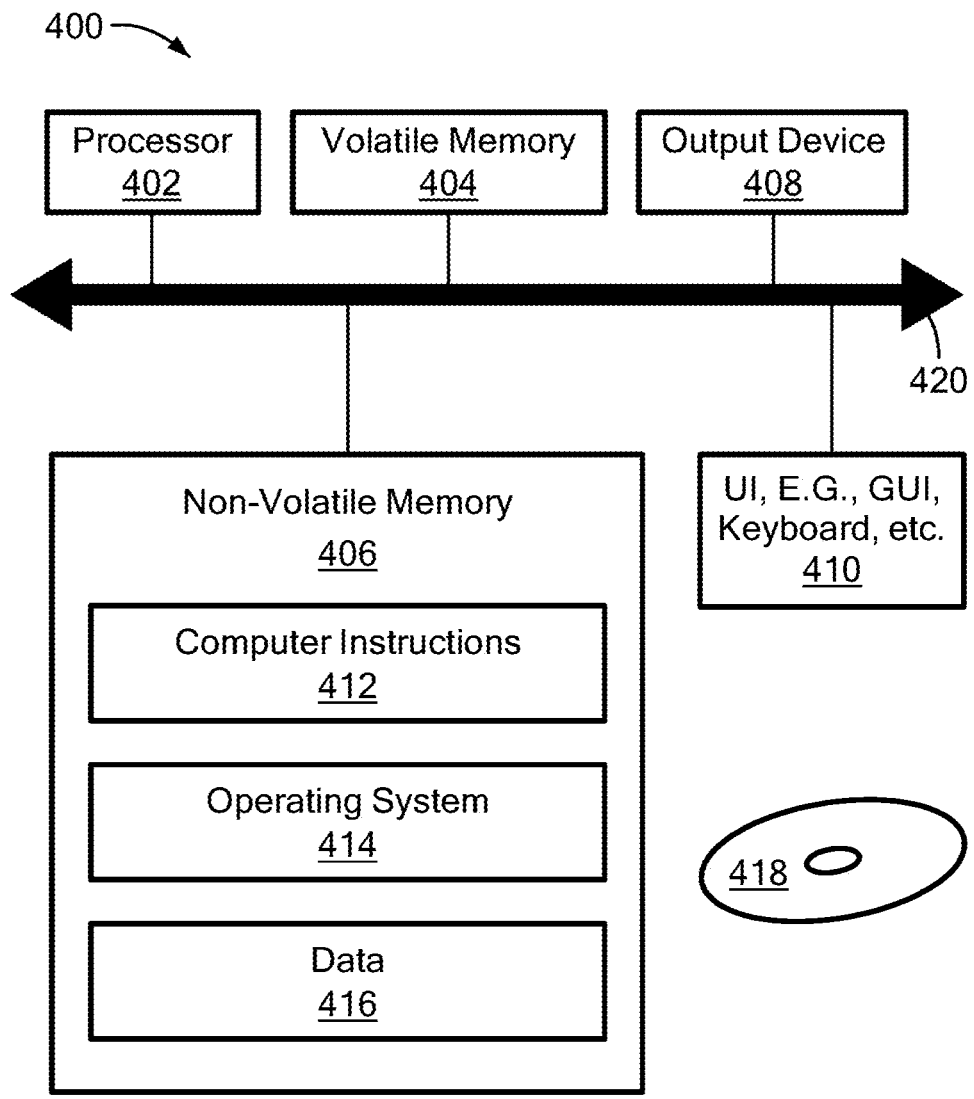
FIG. 4 is a block diagram of an example computer system operative to perform processing, in accordance with the present disclosure.

FIG. 4 is a block diagram of an example computer system 400 operative to perform processing, in accordance with the present disclosure. Computer system 400 can perform all or at least a portion of the processing, e.g., steps in the algorithms and methods, described herein. The computer system 400 includes a processor 402, a volatile memory 404, a non-volatile memory 406 (e.g., hard disk, EEPROM, OTP memory, etc.), an output device 408 and a user input or interface (UI) 410, e.g., graphical user interface (GUI), a mouse, a keyboard, a display, and/or any common user interface, etc. The non-volatile memory (non-transitory storage medium) 406 stores computer instructions 412 (a.k.a., machine-readable instructions or computer-readable instructions) such as software (computer program product), an operating system 414 and data 416. In one example, the computer instructions 412 are executed by the processor 402 out of (from) volatile memory 404. In one embodiment, an article 418 (e.g., a storage device or medium such as a hard disk, an optical disc, magnetic storage tape, optical storage tape, flash drive, etc.) includes or stores the non-transitory computer-readable instructions. Bus 420 is also shown.

Processing may be implemented in hardware, software, or a combination of the two. Processing may be implemented in computer programs (e.g., one or more software applications) executed on programmable computers/machines that each includes a processor, a storage medium or other article of manufacture that is readable by the processor (including volatile and non-volatile memory and/or storage elements), and optionally at least one input device, and one or more output devices. Program code may be applied to data entered using an input device or input connection (e.g., a port or bus) to perform processing and to generate output information.

The system 400 can perform processing, at least in part, via a computer program product or software application, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer. Processing may also be implemented as a machine-readable storage medium, configured with a computer program, where upon execution, instructions in the computer program cause the computer to operate. Further, the terms "computer" or "computer system" may include reference to plural like terms, unless expressly stated otherwise.

Processing may be performed by one or more programmable processors executing one or more computer programs to perform the functions of the system. All or part of the system may be implemented as, special purpose logic circuitry, e.g., an FPGA (field programmable gate array) and/or an ASIC (application-specific integrated circuit). In some examples, digital logic circuitry, e.g., one or more FPGAs, can be operative as a processor as described herein.

Accordingly, aspects, examples, and/or embodiments of the inventive subject matter can afford various benefits relative to prior art techniques. For example, embodiments and examples of the present disclosure can provide variable-length shift registers than can be configured to optimize the speed of data transmission over a serial interface, e.g., in the case where users do not need to use the full bit-length of the serial transmission.

Various embodiments of the concepts, systems, devices, structures, and techniques sought to be protected are described above with reference to the related drawings. Alternative embodiments can be devised without departing from the scope of the concepts, systems, devices, structures, and techniques described. For example, while examples are described as including non-volatile memory, other examples may include volatile memory, e.g., which may be programmed after a configurable variable-length shift register is enabled or powered for use. Further, while certain flip-flops have been referenced above and/or in the drawings, e.g., set-reset (S-R) flip-flops, the scope of the present disclosure includes use of other types of flip-flops (latches), e.g., example/embodiments can include JK flip-flops, data (D) flip-flops, and/or toggle (T) flip-flops with suitable connections.

It is noted that various connections and positional relationships (e.g., over, below, adjacent, etc.) may be used to describe elements and components in the description and drawings. These connections and/or positional relationships, unless specified otherwise, can be direct or indirect, and the described concepts, systems, devices, structures, and techniques are not intended to be limiting in this respect. Accordingly, a coupling of entities can refer to either a direct or an indirect coupling, and a positional relationship between entities can be a direct or indirect positional relationship.

As an example of an indirect positional relationship, positioning element "A" over element "B" can include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. The terms "comprise," "comprises," "comprising," "include," "includes," "including," "has," "having," "contains" or "containing," or any other variation are intended to cover a non-exclusive inclusion. For example, an apparatus, a method, a composition, a mixture, or an article, that includes a list of elements is not necessarily limited to only those elements but can include other elements not expressly listed or inherent to such apparatus, method, composition, mixture, or article.

Additionally, the term "exemplary" means "serving as an example, instance, or illustration. Any embodiment or design described as "exemplary" is not necessarily to be construed as preferred or advantageous over other embodiments or designs. The terms "one or more" and "at least one" indicate any integer number greater than or equal to one, i.e., one, two, three, four, etc. The term "plurality" indicates any integer number greater than one. The term "connection" can include an indirect "connection" and a direct "connection".

References in the specification to "embodiments," "one embodiment," "an embodiment," "an example embodiment," "an example," "an instance," "an aspect," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it may affect such feature, structure, or characteristic in other embodiments whether explicitly described or not.

Relative or positional terms including, but not limited to, the terms "upper," "lower," "right," "left," "vertical," "horizontal, "top," "bottom," and derivatives of those terms relate to the described structures and methods as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another, or a temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within plus or minus (±) 10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within +5% of one another in some embodiments, and yet within ±2% of one another in some embodiments.

The term "substantially" may be used to refer to values that are within ±20% of a comparative measure in some embodiments, within +10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

The disclosed subject matter is not limited in its application to the details of construction and to the arrangements of the components set forth in the following description or illustrated in the drawings. The disclosed subject matter is capable of other embodiments and of being practiced and carried out in various ways.

Also, the phraseology and terminology used in this patent are for the purpose of description and should not be regarded as limiting. As such, the conception upon which this disclosure is based may readily be utilized as a basis for the designing of other structures, methods, and systems for carrying out the several purposes of the disclosed subject matter. Therefore, the claims should be regarded as including such equivalent constructions as far as they do not depart from the spirit and scope of the disclosed subject matter.

Although the disclosed subject matter has been described and illustrated in the foregoing exemplary embodiments, the present disclosure has been made only by way of example. Thus, numerous changes in the details of implementation of the disclosed subject matter may be made without departing from the spirit and scope of the disclosed subject matter.

Accordingly, the scope of this patent should not be limited to the described implementations but rather should be limited only by the spirit and scope of the following claims.

All publications and references cited in this patent are expressly incorporated by reference in their entirety.

What is claimed is:

1. A configurable variable-length shift register circuit for adjusting an output data format to a desired bit-length for data communication, the circuit comprising:
   a plurality of flip-flops connected in a serial configuration, wherein the plurality of flip-flops is connected to a serial-in line and a clock line, wherein in each flip-flop includes a data input, a clock input configured to receive a clock signal from the clock line, and a data output, and wherein the plurality of flip-flops includes a serial-out line;
   a plurality of multiplexers connected to the plurality of flip-flops, wherein each multiplexer includes first and second data inputs and a control input, wherein one of the first and second data inputs is connected to the serial-in line, wherein the control input selects between the data inputs, and wherein each multiplexer includes an output connected to the input of a respective flip-flop;

a nonvolatile memory connected to the plurality of multiplexers and configured to receive a register-length indication, wherein the register-length indication corresponds to a selected number of flip-flops selected for enablement; and a programming interface connected to the nonvolatile memory and configured to allow a user to input the register-length indication;

wherein the nonvolatile memory is operative to configure the plurality of multiplexers to enable a plurality of enabled flip-flops corresponding in number to the register-length indication, and wherein the plurality of enabled flip-flops of the variable-length shift register is configured to produce a data output with an output data format having a desired bit-length corresponding to the number of enabled flip-flops.

2. The circuit of claim 1, further comprising an interface driver configured to communicate with the plurality of flip-flops and one or more device registers, wherein the interface driver is connected to the output of each flip-flop, and wherein the interface driver is configured to move data between the plurality of flip-flops and the one or more device registers.

3. The circuit of claim 2, wherein the interface driver comprises a serial interface.

4. The circuit of claim 3, wherein the serial interface comprises a serial-peripheral interface (SPI).

5. The circuit of claim 3, wherein the serial interface comprises a universal asynchronous receiver/transmitter (UART) interface.

6. The circuit of claim 3, wherein the serial interface comprises universal an I2C interface.

7. The circuit of claim 2, wherein each of the flips-flops of the plurality of flip-flops includes a set input and a clear input, and wherein the interface driver is configured to provide set and clear signals to each of the flip-flops.

8. The circuit of claim 2, wherein the interface driver is configured to transfer data to the plurality of enabled flip-flops in parallel.

9. The circuit of claim 1, wherein the circuit comprises an integrated circuit.

10. The circuit of claim 1, wherein the nonvolatile memory comprises an electrically-erasable read-only (EEPROM) memory.

11. The circuit of claim 1, wherein the nonvolatile memory comprises one-time programmable (OTP) memory.

12. The circuit of claim 11, wherein the OTP memory comprises FLASH memory.

13. The circuit of claim 11, wherein the OTP comprises ROM.

14. The circuit of claim 1, wherein the plurality of (N) multiplexers corresponds in number to the plurality of (N) flip-flops.

15. The circuit of claim 1, wherein the plurality of flip-flops comprises N flip-flops and the plurality of multiplexers comprises N-1 multiplexers.

16. The circuit of claim 15, wherein the plurality of multiplexers is connected to the plurality of flip-flops, and wherein a first flip-flop in the serial configuration is not connected to a multiplexor.

17. The circuit of claim 16, wherein the first flip-flop is configured to receive data from the serial-in line.

18. The circuit of claim 1, wherein the plurality of flip-flops comprises set-reset (S-R) flip-flops.

19. The circuit of claim 1, wherein the plurality of flip-flops comprises JK flip-flops.

20. The circuit of claim 1, wherein the plurality of flip-flops comprises data (D) flip-flops.

21. The circuit of claim 1, wherein the plurality of flip-flops comprises toggle (T) flip-flops.

22. The circuit of claim 1, wherein the output data format comprises a serial format.

23. A configurable variable-length shift register integrated circuit (IC) for adjusting an output data format to a desired bit-length for data communication, the IC comprising:

a plurality of flip-flops connected in a serial configuration, wherein the plurality of flip-flops is connected to a serial-in line and a clock line having, wherein in each flip-flop includes a data input, a clock input configured to receive a clock signal from the clock line, and a data output, and wherein the plurality of flip-flops includes a serial-out line;

a plurality of multiplexers connected to the plurality of flip-flops, wherein each multiplexor includes first and second data inputs and a control input, wherein the control input selects between the data inputs, and wherein each multiplexer includes an output connected to the input of a respective flip-flop;

a nonvolatile memory connected to the plurality of multiplexers and configured to enable one or more flip-flops by configuration of the plurality of multiplexers, wherein the register-length indication corresponds to a selected number of flip-flops selected for enablement;

a programming interface connected to the nonvolatile memory and configured to allow a user to input the register-length indication; and an interface driver configured to communicate with the plurality of flip-flops and one or more device registers, wherein the interface driver is connected to the output of each flip-flop, and wherein the interface driver is configured to move data between the plurality of flip-flops and the one or more device registers;

wherein the nonvolatile memory is operative to configure the plurality of multiplexers to enable a plurality of enabled flip-flops having a number of enabled flip-flops corresponding to the register-length indication, and wherein the plurality of enabled flip-flops of the variable-length register is configured to produce a data output with an output data format having a desired bit-length corresponding to the number of enabled flip-flops.

24. The IC of claim 23, wherein the nonvolatile memory comprises an electrically-erasable read-only (EEPROM) memory.

25. The IC of claim 23, wherein the nonvolatile memory comprises one-time programmable (OTP) memory.

26. The circuit of claim 25, wherein the OTP memory comprises FLASH memory.

27. The circuit of claim 25, wherein the OTP comprises ROM.

28. The IC of claim 23, wherein the interface driver comprises a serial interface.

29. The circuit of claim 28, wherein the serial interface comprises a serial-peripheral interface (SPI).

30. The circuit of claim 28, wherein the serial interface comprises a universal asynchronous receiver/transmitter (UART) interface.

31. The circuit of claim 28, wherein the serial interface comprises an I2C interface.

32. The IC of claim 28, wherein the IC is configured for controlling a motor driver.

33. The IC of claim 23, wherein each of the flips-flops of the plurality of flip-flops includes a set input and a clear input, and wherein the interface driver is configured to provide set and clear signals to each of the flip-flops.

34. The IC of claim 23, wherein the plurality of (N) multiplexers corresponds in number to the plurality of (N) flip-flops.

35. The IC of claim 23, wherein the plurality of flip-flops comprises N flip-flops and the plurality of multiplexers comprises N-1 multiplexers.

36. The IC of claim 35, wherein the plurality of multiplexers is connected to the plurality of flip-flops, wherein a first flip-flop in the serial configuration is not connected to a multiplexor.

37. The IC of claim 36, wherein the first flip-flop is configured to receive data from the serial-in line.

38. The IC of claim 23, wherein the plurality of flip-flops comprises set-reset (S-R) flip-flops.

39. The IC of claim 23, wherein the plurality of flip-flops comprises JK flip-flops.

40. The IC of claim 23, wherein the plurality of flip-flops comprises data (D) flip-flops.

41. The IC of claim 23, wherein the plurality of flip-flops comprises toggle (T) flip-flops.

42. The IC of claim 23, wherein the interface driver is connected to one or more device registers.

43. The IC of claim 42, wherein the one or more device registers are connected to transducer circuitry.

44. The IC of claim 43, wherein the transducer circuitry comprises a sensor.

45. The IC of claim 44, wherein the sensor comprises a magnetic field sensor.

46. The IC of claim 45, wherein the magnetic field sensor comprises one or more Hall effect elements.

47. The IC of claim 45, wherein the magnetic field sensor comprises one or more magnetoresistance elements.

48. The IC of claim 44, wherein the sensor comprises a temperature sensor.

49. The IC of claim 44, wherein the sensor comprises a current sensor.

50. The IC of claim 43, wherein the transducer circuitry comprises an analog-to-digital converter (ADC).

* * * * *

UNITED STATES PATENT AND TRADEMARK OFFICE
CERTIFICATE OF CORRECTION

PATENT NO. : 11,972,154 B2
APPLICATION NO. : 17/816758
DATED : April 30, 2024
INVENTOR(S) : Matthew Hein Page 1 of 1

It is certified that error appears in the above-identified patent and that said Letters Patent is hereby corrected as shown below:

In the Specification

Column 5, Line 26, delete "volatile memory 220" and replace with --non-volatile memory 220--.

Column 6, Line 15, delete ", 313(1)," and replace with --, (312)(1),--.

Column 6, Line 64, delete "329" and replace with --319--.

Column 7, Line 16, delete "arrows 1-3." and replace with --circled arrows 1-3.--.

Column 7, Line 29, delete "arrows 1-3." and replace with --circled arrows 1-3.--.

Signed and Sealed this
Eleventh Day of February, 2025

Coke Morgan Stewart
*Acting Director of the United States Patent and Trademark Office*